United States Patent
Tamagawa

Patent Number: 5,151,666
Date of Patent: Sep. 29, 1992

[54] OSCILLATION STOPPAGE DETECTION CIRCUIT

[75] Inventor: Akio Tamagawa, Tokyo, Japan

[73] Assignee: NEC Corpoation, Tokyo, Japan

[21] Appl. No.: 827,977

[22] Filed: Jan. 30, 1992

[30] Foreign Application Priority Data

Jan. 30, 1991 [JP] Japan .................................. 3-9872

[51] Int. Cl.⁵ .............................................. H03B 1/00
[52] U.S. Cl. ...................................... 331/64; 331/158
[58] Field of Search ................. 331/64, 158; 324/225, 324/236

[56] References Cited

U.S. PATENT DOCUMENTS

| | | | |
|---|---|---|---|
| 3,370,251 | 2/1968 | Overstreet, Jr. ....................... | 331/64 |
| 3,736,523 | 5/1973 | Puskas .................................... | 331/64 |
| 4,257,010 | 3/1981 | Bergman et al. ..................... | 324/236 |

FOREIGN PATENT DOCUMENTS

| | | | |
|---|---|---|---|
| 0204607 | 11/1983 | Japan ..................................... | 331/64 |
| 0287701 | 12/1987 | Japan ..................................... | 331/64 |

*Primary Examiner*—Robert J. Pascal
*Attorney, Agent, or Firm*—Helfgott & Karas

[57] ABSTRACT

An oscillation stoppage detecting circuit has a boost circuit to which is inputted an output of an oscillation circuit and a level detection circuit to which is inputted an output of the boost circuit. The boost circuit used here is, for example, a voltage doubler circuit which utilizes two diodes, a capacitor and an inverter, which is so-called a charge pump circuit. The boost circuit is operated by the oscillation output of the oscillation circuit and the oscillation stoppage is detected as a result of the comparison between the output voltage of the boost circuit and a threshold voltage of the level detection circuit. The arrangement enables to realize a circuit of low power consumption.

8 Claims, 4 Drawing Sheets

OSCILLATION STOPPAGE DETECTION CIRCUIT

BACKGROUND OF THE INVENTION (1) Field of the Invention

The present invention relates to an integrated circuit and, more particularly, to a detection circuit for use in an integrated circuit with an oscillation circuit, which detects oscillation stoppage of the oscillation circuit.

(2) Description of the Related Art

An integrated circuit having a timer or clock function makes use of a crystal oscillator because of a high stability in its oscillation frequency characteristics. FIG. 1 shows a circuit configuration of such crystal oscillation circuit used in an integrated circuit. As shown therein, normally there are formed, on a chip of the integrated circuit, one inverter INV operating as an amplifier and a feedback resistor Rf for setting an operating point and, externally thereof, are connected a crystal resonator XL and two capacitors Cg and Cd.

The capacitance value of each of the externally connected capacitors Cg, Cd is in the order of 10~30 pF. and the driving capability of the amplifying inverter INV is lowered with a decrease in the power supply voltage, which sometimes results in the stoppage of the oscillating operation.

Where an integrated circuit having such a timer or clock function together with a microcomputer is incorporated in a system, if the crystal oscillation circuit stops its oscillation caused by a reason such as a drop in the power supply voltage during operation, the integrated circuit with such a timer function issues an oscillation stoppage signal and warns the microcomputer that the timer data are invalid and this is very desirable for ensuring the reliability of the entire system.

In a conventional circuit, a frequency-voltage converting circuit and a level detection circuit have been used in order to detect the stoppage of an oscillation circuit. FIG. 2 shows such a conventional oscillation stoppage detection circuit 5 in a block diagram. In this circuit, while the oscillation continues at the oscillation circuit 1, the frequency-voltage converting circuit 6 outputs an output of a constant value. When the oscillation stops, the output of the frequency-voltage converting circuit 6 becomes 0 V. This change is detected by the level detection circuit 4, whereby the stoppage of the oscillation is detected and the detection signal is outputted from a detection output terminal DT.

FIG. 3 shows in a circuit diagram some more details of the frequency-voltage converting circuit 6 of the conventional oscillation stoppage detection circuit 5 shown in FIG. 2 with blocks. The frequency-voltage converting circuit 6 is constituted by a one-shot multivibrator 61, a constant-current source 62, a switch 63 and a smoothing circuit 64.

Here, when a signal $V_{IN}$ of frequency $f_{in}$ (Hz) is inputted to the frequency-voltage converting circuit 6 from the oscillation circuit 1, the one-shot multivibrator 61 produces pulses having a pulse width of $t_o$ in synchronization with a leading edge of the input signal. This pulse signal causes the switch 63 to turn ON and OFF, and thus electric charges in proportion to the frequencies are supplied to the smoothing circuit 64. The output voltage $V_{OUT}$ of the frequency-voltage converting circuit 6 is assumed that the frequencies of the input signal $V_{IN}$ is $f_{in}$, the current value of the constant-current source 62 is $I_o$ and the resistance value of the smoothing circuit 64 is R1. Then, it follows that:

$$\frac{V_{OUT}}{R1} = I_o \text{ to } f_{in}$$

$$\therefore V_{OUT} = (I_o \text{ to } R1) \times f_{in}$$

From this equation, it can be appreciated that the output voltage $V_{OUT}$ of the frequency-voltage converting circuit 6 is proportional to the frequencies of the input signal $V_{IN}$.

It is by appropriately setting this proportional coefficient ($I_o$ to R1) and the detection voltage of the level detection circuit 4 that the oscillation stoppage can be detected.

However, since the above conventional oscillation stoppage detection circuit 5 makes use of the frequency-voltage converting circuit 6 as explained above, it is necessary to cause the direct current to flow constantly and this results in an increase in the consumption of power.

Also, since the one-shot multivibrator 61 is used, this results in an increase in the number of elements involved and in requiring a larger chip area occupied thereby.

SUMMARY OF THE INVENTION

It is, therefore, an object of the invention to overcome the problems existing in the conventional detection circuit, and to provide an improved oscillation stoppage detection circuit.

It is another object of the invention to provide an oscillation stoppage detection circuit which is operable under a low power consumption and which is also operable even if the power source voltage is substantially low.

It is a further object of the invention to provide an oscillation stoppage detection circuit which is constituted by a boost circuit to which an output of an oscillation circuit is inputted and a level detection circuit to which is inputted an output of the boost circuit. Here, the boost circuit is a voltage doubler boost circuit as an example which utilizes two diodes, a capacitor and an inverter, which is the so-called a charge pump circuit. The boost circuit is operated by the oscillation output of the oscillation circuit to be detected, and the oscillation stoppage is detected as a result of the comparison of the output voltage of the boost circuit by the level detection circuit.

According to one aspect of the invention, there is provided an oscillation stoppage detection circuit for use in an integrated circuit having an oscillation circuit, said detection circuit comprises:

a boost circuit which receives at its input node an output of said oscillation circuit and which includes a first diode having its anode connected to a power source terminal, a second diode having its cathode connected to an output node for outputting an output voltage of said boost circuit, a capacitor having one end connected to a common junction node between said first and second diodes, an inverter having its output terminal connected to the other end of said capacitor and its input terminal connected to said input node of said boost circuit, and a smoothing circuit connected between the output node of said boost circuit and a ground; and a level detection circuit which is connected to said output node of said boost circuit and which detects said output voltage of said boost circuit thereby to detect an oscillation stoppage at said oscillation circuit when said output voltage of said boost circuit becomes lower than a predetermined detection level.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the present invention will be explained in detail with reference to the accompanying drawings. It should be noted that throughout the following explanation, similar reference symbols or numerals refer to the same or similar elements in all the figures of the drawings.

Figure 4:
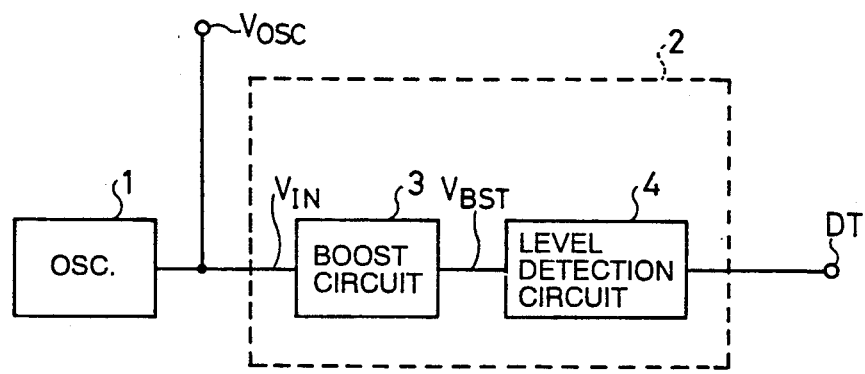
FIG. 4 is a block diagram showing a general configuration of an oscillation stoppage detection circuit according to the invention.

FIG. 4 shows, in a block diagram, an oscillation stoppage detection circuit 2 according to the present invention.

In the circuit shown in FIG. 4, a boost circuit 3 is operated by the oscillation output signal ($V_{IN}$) from an oscillation circuit 1 and the output voltage $V_{BST}$ of the boost circuit 3 is compared by a level detection circuit 4 whereby the oscillation stoppage is detected and an detection signal is outputted from a detection output terminal DT.

Figure 5:
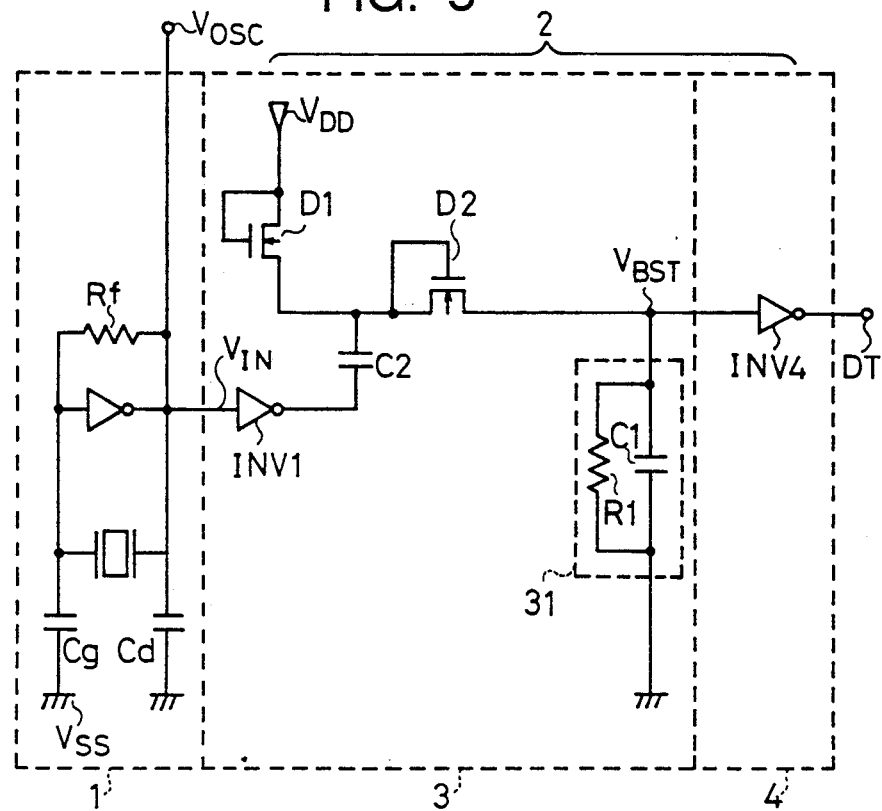
FIG. 5 is a circuit diagram showing a detailed example of the circuit of a first embodiment according to the invention.

FIG. 5 shows in blocks a detailed circuit diagram of the oscillation stoppage detection circuit 2 shown in FIG. 4 of a first embodiment according to the present invention.

Figure 1:
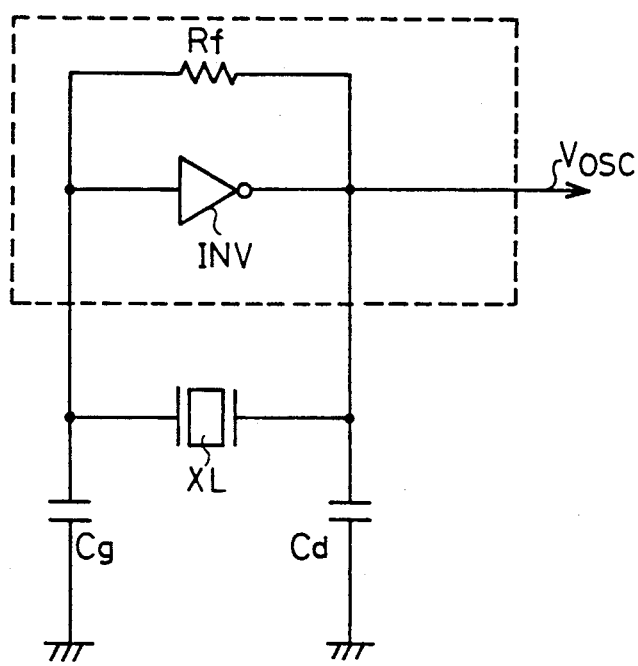
FIG. 1 is a circuit diagram of a conventional crystal oscillation circuit.
Figure 2:
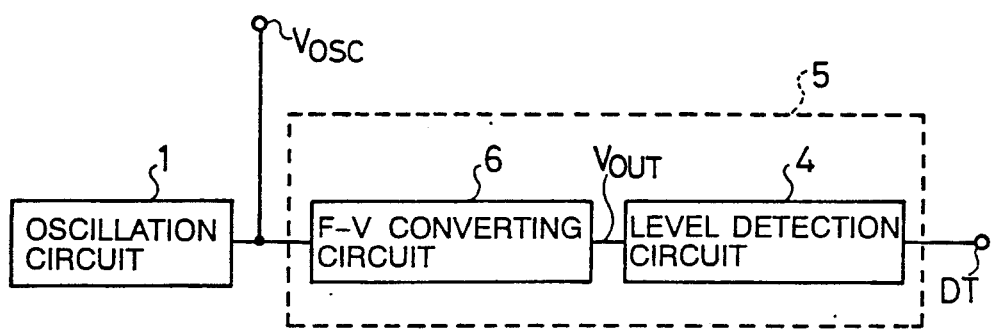
FIG. 2 is a block diagram showing a conventional oscillation stoppage detection circuit.
Figure 3:
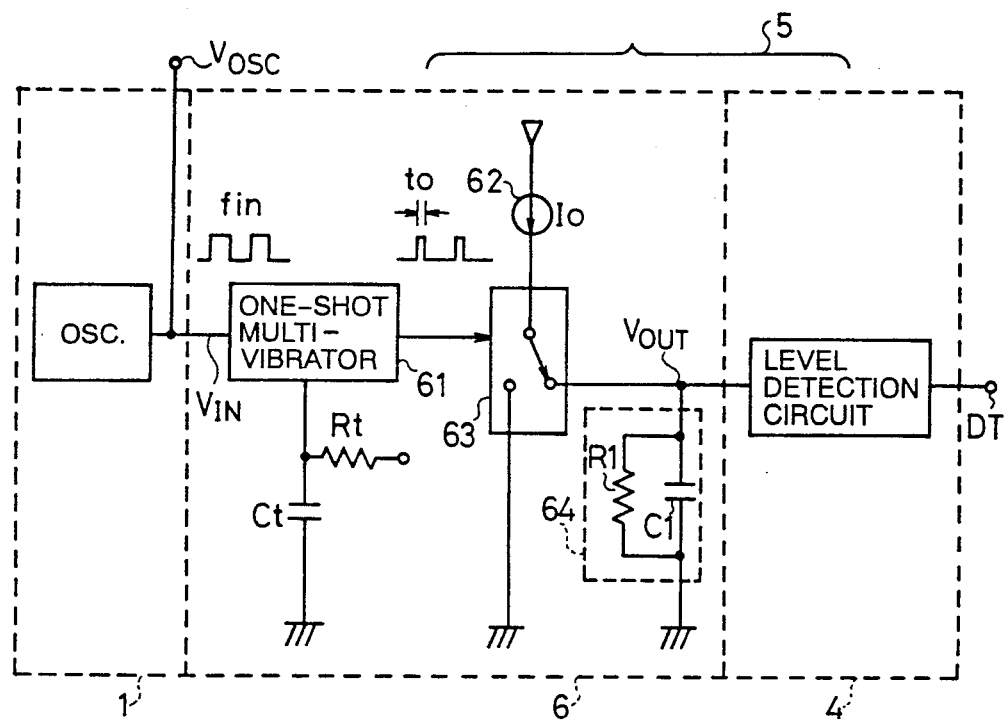
FIG. 3 is a circuit diagram showing a detailed configuration of the conventional oscillation stoppage detection circuit shown in FIG. 2.

As shown in FIG. 5, the oscillation circuit 1 is an ordinary crystal oscillation circuit as shown in FIG. 1. The boost circuit 3 is the so-called charge pump circuit, formed by a first diode D1 and a second diode D2, a capacitor C2, an inverter INV1 and a smoothing circuit 31. Each of the two diodes D1, D2 is an N-channel MOS transistor whose gate and drain are connected with each other so as to be an anode. If the process involved permits the use of an ordinary PN-junction diode, it is possible to suppress the forward voltage drop of the diode to a small extent so that the boost efficiency can be enhanced. The first diode D1 has an anode connected to the power supply source $V_{DD}$ and a cathode connected to an anode of the second diode D2. A cathode of the second diode D2 is connected to one end of the smoothing circuit 31 whose the other end is grounded. The inverter INV1 receives the output signal from the oscillation circuit 1 and it forwards an output thereof to the common junction node of the two diodes D1, D2 through the capacitor C2. The output $V_{BST}$ of the boost circuit 3 is derived from the common junction node of the second diode D2 and the smoothing circuit 31. Thus, it can be readily understood that the boost circuit 3 of this first embodiment is a voltage doubler boost circuit.

Now, the operation of the boost circuit 3 shown in FIG. 5 is explained.

When the output of the inverter INV1 is 0 V, the capacitor C2 is charged to ($V_{DD}-Vt1$). Here, $V_{DD}$ is the power source voltage and Vt1 is a threshold voltage of the first diode D1. When the output of the inverter INV1 rises to the power source voltage $V_{DD}$, the charge accumulated in the capacitor C2 is forwarded to the smoothing circuit 31 through the second diode D2 and charged in the capacitor C1 therein. While the oscillation continues, the charging to the capacitor C1 is repeated, so that the output potential of the boost circuit 3 is maintained at ($2 \cdot V_{DD}-Vt1-Vt2$). Here, Vt2 is a threshold voltage of the second diode D2.

When the oscillation stops, the supplying of the charge to the smoothing circuit 31 from the capacitor C2 ceases, so that the charge having been accumulated in the capacitor C1 is discharged to the ground through the resistor R1. The output potential $V_{BST}$ of the boost circuit 3 at the completion of the discharging is ($V_{DD}-Vt1-Vt2$). If the level of the detection voltage of the level detection circuit 4 is set to ($V_{DD}-Vt1-Vt2$) or larger, the oscillation stoppage can be detected.

Figure 7:
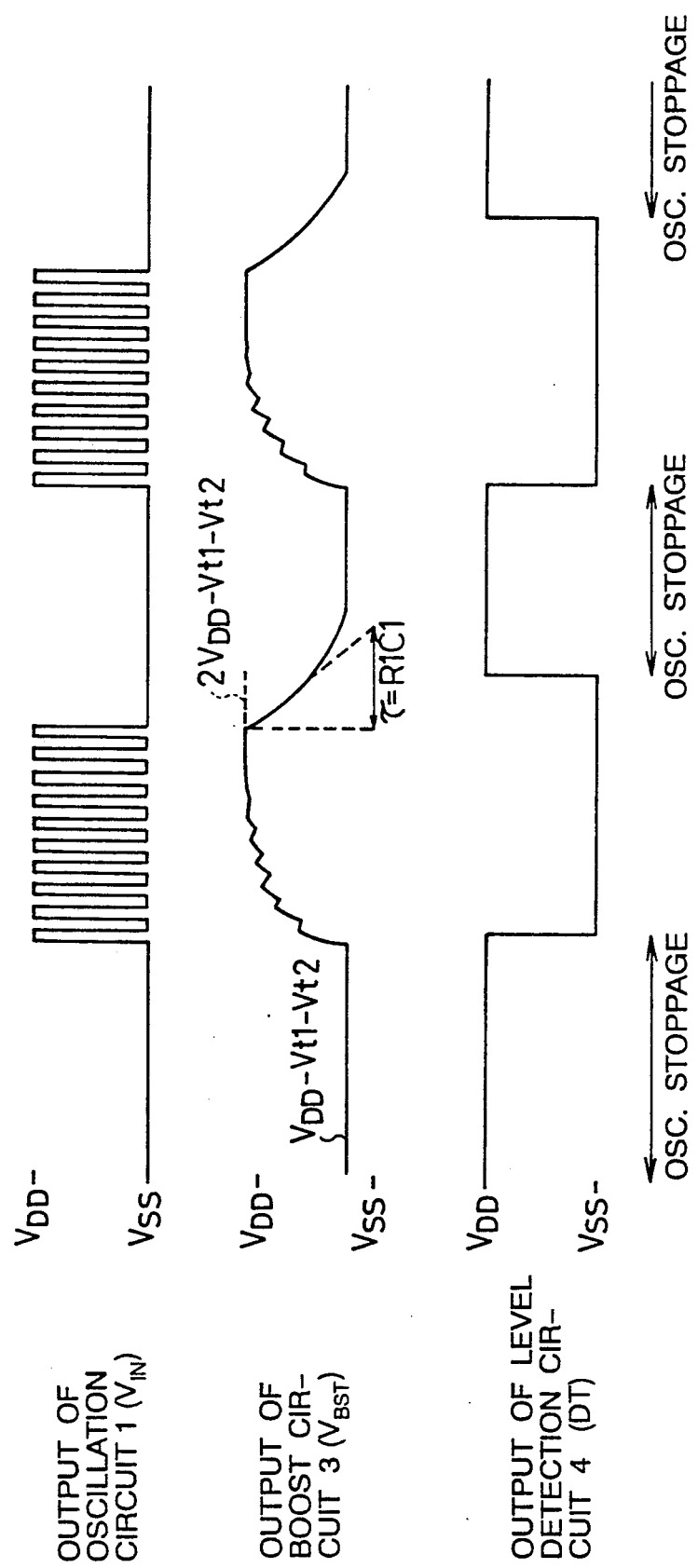
FIG. 7 is a timing chart for the circuit shown in FIG. 5.

FIG. 7 shows a timing chart to show the above explained operation.

At the stoppage of the oscillating operation, the output potential $V_{BST}$ of the boost circuit 3 is ($V_{DD}-Vt1-Vt2$). When the oscillation starts, the boost circuit 3 operates and its output voltage rises up to ($2 \cdot V_{DD}-Vt1-Vt2$). If the capacitor C2 at the boosting circuit side and the capacitor C1 at the smoothing circuit side are designed to have the same value (in the order of several pF), the output voltage $V_{BST}$ of the boost circuit 3 becomes saturated in several cycles. When the oscillation stops, the output voltage $V_{BST}$ of the boost circuit 3 is discharged in the time period according to $\tau = R1 \cdot C1$ which is the time constant of the smoothing circuit 31. In order to suppress the current consumption, the higher the value of the resistor R1, the better. In the actual circuit, if the value of the resistor R1 is made to be in the order of 100 M$\Omega$ through the utilization of such as a leakage current from the related diode, it is possible to suppress the direct current at the boost circuit 3 to lower than $\mu$A order. Assuming that the capacitor C1 of the smoothing circuit 31 is 1 pF and the resistor R1 is 100 M$\Omega$, the time constant becomes $\tau = 1 \text{ pF} \times 100 \text{ M}\Omega = 100$ $\mu$sec, which presents no problems from practical aspects.

An example of the integrated circuit to which the present invention may be embodied is an integrated circuit intended for a clock or timer, in which case the output signal is normally of 1 Hz so that the time constant $\tau$ of the smoothing circuit 31 can be prolonged to about 100 msec.

Figure 6:
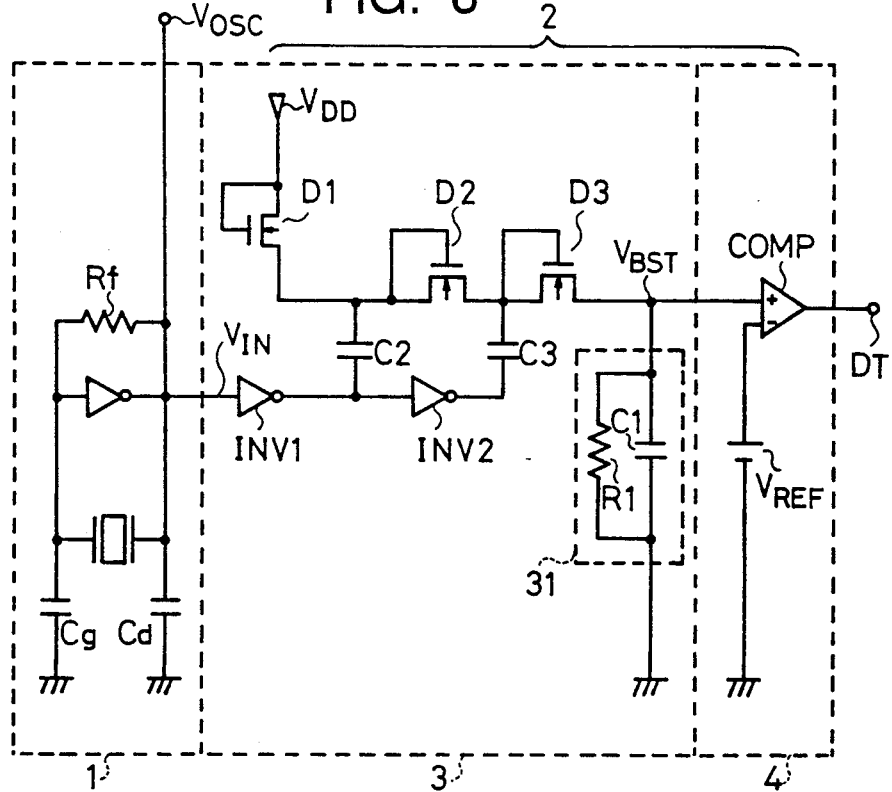
FIG. 6 is a circuit diagram showing a detailed example of the circuit of a second embodiment according to the invention.

FIG. 6 shows in blocks a detailed configuration of a circuit of a second embodiment according to the invention.

As shown in FIG. 6, the boost circuit 3 according to this embodiment employs a voltage triplex boost circuit whereas the first embodiment employs a voltage doubler boost circuit. As clearly shown in FIG. 6, a second inverter INV2 and a third diode D3 are added to the boost circuit 3 shown in FIG. 5. The output voltage $V_{BST}$ of this boost circuit 3 is $(3 \cdot V_{DD} - Vt1 - Vt2 - Vt3)$ so that, even where the power source voltage $V_{DD}$ is low, the output voltage $V_{BST}$ of the boost circuit 3 can be raised with certainty. Here, Vt3 is a forward voltage drop of the third diode D3.

In the arrangement according to this second embodiment, in place of the inverter INV4 used for the level detection circuit 4 in the first embodiment explained above, the use is made of a comparator COMP which compares the output voltage $V_{BST}$ of the boost circuit 3 and the reference voltage $V_{REF}$ for detecting the stoppage of oscillation. In this second embodiment, since the threshold voltage of the level detection circuit 4 can be set at a given value by changing the value of the reference voltage $V_{REF}$, thereby increasing freedom of design choice.

As has been explained hereinabove, according to the present invention, since the frequency-voltage conversion circuit as used in the conventional circuit for detecting the oscillation stoppage has been replaced by the boost circuit of a charge pump type, it is possible to suppress the consumption of direct current thereby enabling to realize a circuit of low power consumption.

Also, whereas the frequency-voltage conversion circuit has required a one-shot multivibrator, such circuit is unnecessary in the charge pump type boost circuit, so that it is possible to decrease the number of elements, to make the chip area small, and to enhance the reliability in the operation of the oscillation stoppage circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An oscillation stoppage detection circuit for use in an integrated circuit having an oscillation circuit, said detection circuit comprising:

a boost circuit which receives at its input node an output of said oscillation circuit and which includes a first diode having its anode connected to a power source terminal, a second diode having its cathode connected to an output node for outputting an output voltage of said boost circuit, a capacitor having one end connected to a common junction node between said first and second diodes, an inverter having its output terminal connected to the other end of said capacitor and its input terminal connected to said input node of said boost circuit, and a smoothing circuit connected between the output node of said boost circuit and a ground; and a level detection circuit which is connected to said output node of said boost circuit and which detects said output voltage of said boost circuit thereby to detect an oscillation stoppage at said oscillation circuit when said output voltage of said boost circuit becomes lower than a predetermined detection level.

2. An oscillation stoppage detection circuit according to claim 1, in which each of said first and second diodes in said boost circuit is a diode connected N-channel MOS transistor having its gate and drain connected with each other to function as an anode terminal.

3. An oscillation stoppage detecting circuit according to claim 1, in which said level detection circuit is constituted by an inverter whose threshold value is said detection level.

4. An oscillation stoppage detection circuit according to claim 1, in which said level detection circuit is constituted by a comparator which compares the output voltage from said boost circuit with a reference voltage inputted thereto.

5. An oscillation stoppage detection circuit for use in an integrated circuit having an oscillation circuit, said detection circuit comprising:

a boost circuit which receives at its input node an output of said oscillation circuit and which includes a first, a second and a third diode connected in series with an anode of said first diode connected to a power source terminal and a cathode of said third diode connected to an output node for outputting an output voltage of said boost circuit, a first capacitor having one end connected to a common junction node between said first and second diodes, a second capacitor having one end connected to a common junction node between said second and third diodes, a first inverter having its output terminal connected to the other end of said first capacitor and its input terminal connected to said input node of said boost circuit, a second inverter having its input terminal connected to the output terminal of said first inverter and its output terminal connected to the other end of said second capacitor, and a smoothing circuit connected between the output node of said boost circuit and a ground; and a level detection circuit which is connected to said output node of said boost circuit and which detects said output voltage of said boost circuit thereby to detect an oscillation stoppage at said oscillation circuit when said output voltage of said boost circuit becomes lower than a predetermined detection level.

6. An oscillation stoppage detection circuit according to claim 5, in which each of said first, second and third diodes in said boost circuit is a diode connected N-channel MOS transistor having its gate and drain connected with each other to function as an anode terminal.

7. An oscillation stoppage detecting circuit according to claim 5, in which said level detection circuit is constituted by an inverter whose threshold value is said detection level.

8. An oscillation stoppage detection circuit according to claim 5, in which said level detection circuit is constituted by a comparator which compares the output voltage from said boost circuit with a reference voltage inputted thereto.

* * * * *